United States Patent
Glenn

(10) Patent No.: US 8,011,247 B2
(45) Date of Patent: Sep. 6, 2011

(54) MULTISTAGE PROOF-MASS MOVEMENT DECELERATION WITHIN MEMS STRUCTURES

(75) Inventor: Max Glenn, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 560 days.

(21) Appl. No.: 12/147,354

(22) Filed: Jun. 26, 2008

(65) Prior Publication Data
US 2009/0320592 A1 Dec. 31, 2009

(51) Int. Cl.
*G01C 19/00* (2006.01)
(52) U.S. Cl. ............ 73/539; 73/504.12; 73/514.32
(58) Field of Classification Search .......... 73/504.12, 73/503.3, 504.14, 510, 514.16, 514.32, 539
See application file for complete search history.

(56) References Cited

U.S. PATENT DOCUMENTS

| | | | | | |
|---|---|---|---|---|---|
| 4,882,933 | A | * | 11/1989 | Petersen et al. ............ | 73/514.13 |
| 5,025,346 | A | * | 6/1991 | Tang et al. ................. | 361/283.1 |
| 5,111,693 | A | * | 5/1992 | Greiff ......................... | 73/514.35 |
| 5,349,855 | A | * | 9/1994 | Bernstein et al. .......... | 73/504.16 |
| 5,392,650 | A | * | 2/1995 | O'Brien et al. ............. | 73/514.18 |
| 5,415,043 | A | * | 5/1995 | Zabler et al. ............... | 73/514.38 |
| 5,458,000 | A | * | 10/1995 | Burns et al. ................ | 73/708 |
| 5,496,436 | A | * | 3/1996 | Bernstein et al. ........... | 438/50 |
| 5,581,035 | A | * | 12/1996 | Greiff ......................... | 73/514.32 |
| 5,646,348 | A | * | 7/1997 | Greiff et al. ................ | 73/514.36 |
| 5,721,377 | A | * | 2/1998 | Kurle et al. ................. | 73/504.12 |
| 5,817,942 | A | * | 10/1998 | Greiff ......................... | 73/514.01 |
| 5,892,153 | A | * | 4/1999 | Weinberg et al. ........... | 73/504.16 |
| 5,952,574 | A | * | 9/1999 | Weinberg et al. ........... | 73/504.16 |
| 6,040,625 | A | * | 3/2000 | Ip ............................... | 257/719 |
| 6,214,243 | B1 | * | 4/2001 | Muenzel et al. ............. | 216/2 |
| 6,230,566 | B1 | * | 5/2001 | Lee et al. .................... | 73/514.32 |
| 6,257,059 | B1 | * | 7/2001 | Weinberg et al. ........... | 73/504.16 |
| 6,311,556 | B1 | * | 11/2001 | Lefort et al. ................ | 73/514.29 |
| 6,350,983 | B1 | * | 2/2002 | Kaldor et al. ............... | 250/231.1 |
| 6,426,538 | B1 | * | 7/2002 | Knowles ..................... | 257/417 |
| 6,481,285 | B1 | * | 11/2002 | Shkel et al. ................. | 73/504.13 |

(Continued)

FOREIGN PATENT DOCUMENTS
DE 102006033176 1/2008
(Continued)

OTHER PUBLICATIONS
European Patent Office, "European Search Report", Oct. 27, 2009, Published in: EP.

*Primary Examiner* — Hezron E Wiliams
*Assistant Examiner* — Samir Shah
(74) *Attorney, Agent, or Firm* — Fogg & Powers LLC

(57) ABSTRACT

A micro-electromechanical systems (MEMS) device includes a substrate comprising at least one anchor, a proof mass having first and second deceleration extensions extending therefrom, a motor drive comb, a motor sense comb, a plurality of suspensions configured to suspend the proof mass over the substrate and between the motor drive comb and the motor sense comb. The suspensions are anchored to the substrate. A body is attached to the substrate. At least one deceleration beam extends from a first side of said body. The at least one deceleration beam is configured to engage at least one of the first and second deceleration extensions and slow or stop the proof mass before the proof mass contacts the motor drive comb and the motor sense comb.

20 Claims, 2 Drawing Sheets

U.S. PATENT DOCUMENTS

| | | | |
|---|---|---|---|
| 6,865,944 B2 * | 3/2005 | Glenn et al. | 73/504.12 |
| 6,923,062 B2 * | 8/2005 | Franz et al. | 73/514.38 |
| 7,194,903 B2 * | 3/2007 | Dwyer | 73/493 |
| 7,730,783 B2 * | 6/2010 | Classen et al. | 73/514.38 |
| 2001/0042404 A1 * | 11/2001 | Yazdi et al. | 73/504.12 |
| 2002/0011112 A1 * | 1/2002 | Kipp et al. | 73/579 |
| 2002/0046602 A1 | 4/2002 | Geen et al. | |
| 2002/0066317 A1 * | 6/2002 | Lin | 73/504.02 |
| 2002/0093067 A1 * | 7/2002 | Knowles | 257/419 |
| 2002/0167248 A1 * | 11/2002 | Chua et al. | 310/329 |
| 2002/0178817 A1 * | 12/2002 | Selvakumar et al. | 73/514.32 |
| 2002/0184949 A1 * | 12/2002 | Gianchandani et al. | 73/514.29 |
| 2004/0025589 A1 * | 2/2004 | Kurle et al. | 73/488 |
| 2004/0129077 A1 * | 7/2004 | Franz et al. | 73/514.14 |
| 2007/0126069 A1 * | 6/2007 | Muchow et al. | 257/414 |

FOREIGN PATENT DOCUMENTS

WO 2004059250 7/2004

* cited by examiner

MULTISTAGE PROOF-MASS MOVEMENT DECELERATION WITHIN MEMS STRUCTURES

BACKGROUND OF THE INVENTION

Micro-electromechanical systems (MEMS) integrate electrical and mechanical components on the same substrate, for example, a silicon substrate, using microfabrication technologies. The electrical components are fabricated using integrated circuit processes, while the mechanical components are fabricated using micromachining processes compatible with the integrated circuit processes. This combination makes it possible to fabricate an entire system on a chip using standard manufacturing processes.

One common application of MEMS devices is in the design and manufacture of sensor devices. The mechanical portion of the sensor device provides the sensing capability, while the electrical portion of the sensor device processes the information received from the mechanical portion. One example of a MEMS device is a gyroscope. Some inertial measurement units (IMUs) incorporate one or more MEMS gyroscopes.

One known type of MEMS gyroscope uses vibrating elements to sense angular rate through the detection of a Coriolis acceleration. The vibrating elements are put into oscillatory motion along a motor (X) axis, which is parallel to the substrate, in a resonant mode of vibration referred to as a motor mode. Once the vibrating elements are put in motion, the gyroscope is capable of detecting angular rates induced by the substrate being rotated about an input (Z) axis, which is perpendicular to the substrate. Coriolis acceleration occurs along a sense (Y) axis, which is also perpendicular to both the X and Z axes, causing oscillatory motion along the Y-axis, in a resonant mode referred to as a sense mode. The amplitude of oscillation of the sense mode is proportional to the angular rate of the substrate. However, the vibrating elements are sometimes acted upon by external forces. As an example, aircraft or other flight platforms sometimes make high gravitational force maneuvers. The forces can cause proof masses within the MEMS device, for example, a MEMS gyroscope, to contact a motor drive, a motor pickoff or a sense plate, sometimes at such a high rate of speed, that damage can occur to one or more of the above-listed components. Such contact is undesirable and effects performance of the MEMS device.

SUMMARY OF THE INVENTION

In an embodiment, a micro-electromechanical systems (MEMS) device includes a substrate comprising at least one anchor, a proof mass having first and second deceleration extensions extending therefrom, a motor drive comb, a motor sense comb, a plurality of suspensions configured to suspend the proof mass over the substrate and between the motor drive comb and the motor sense comb. The suspensions are anchored to the substrate. A body is attached to the substrate. At least one deceleration beam extends from a first side of said body. The at least one deceleration beam is configured to engage at least one of the first and second deceleration extensions and slow or stop the proof mass before the proof mass contacts the motor drive comb and the motor sense comb.

BRIEF DESCRIPTION OF THE DRAWINGS

Preferred and alternative embodiments of the present invention are described in detail below with reference to the following drawings.

DETAILED DESCRIPTION OF THE PREFERRED EMBODIMENT

Embodiments of the invention may utilize structure and/or concepts described in commonly owned U.S. Pat. No. 6,865, 944, which is herein incorporated by reference in its entirety.

Figure 1:
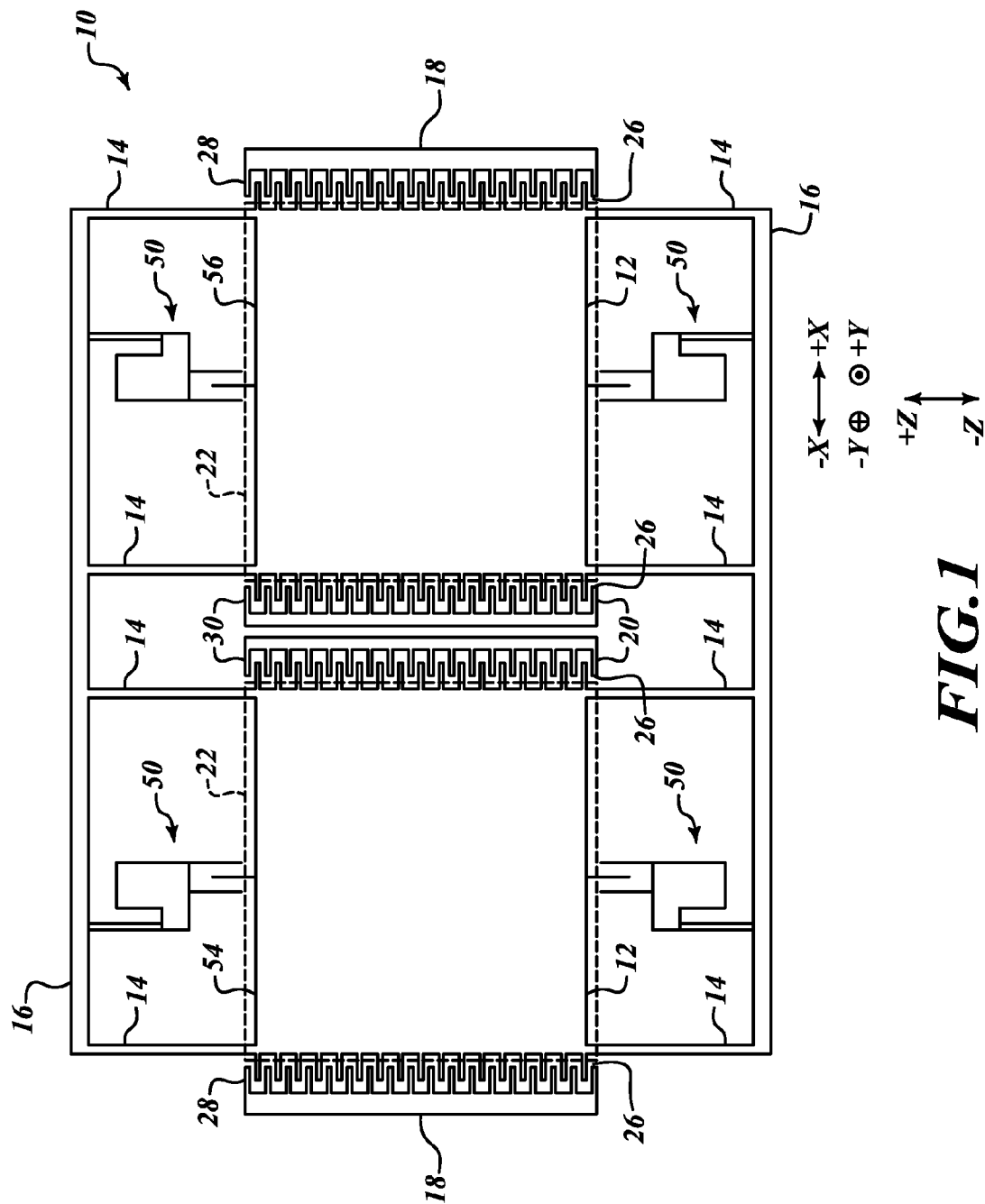
FIG. 1 is an illustration of micro-electromechanical system (MEMS) device which incorporates deceleration stops extending from the proof masses and a support structure.

FIG. 1 illustrates a plan view of a micro-electromechanical system (MEMS) device 10, for example, a gyroscope. MEMS device 10 is formed on a substrate (not shown) and includes at least one proof mass 12, a plurality of suspensions 14 for supporting proof masses 12, and at least one cross beam 16 connected to suspensions 14. In an alternative configuration, suspensions 14 are individually and directly connected to the substrate. MEMS device 10 also includes motor drive combs 18, motor pickoff combs 20, and sense plates 22, which correspond to individual proof masses 12.

Proof masses 12 are fabricated from any mass suitable for use in a MEMS device. In one embodiment, proof mass 12 is a plate of silicon. Other materials compatible with micromachining techniques may also be utilized. While FIG. 1 shows two proof masses 12, MEMS devices utilizing fewer or greater than two proof masses may also be utilized.

Proof masses 12 are located substantially between motor drive comb 18 and motor pickoff comb 20. Proof masses 12 include a plurality of comb-like electrodes 26. A portion of electrodes 26 extends towards motor drive comb 18 and a portion of electrodes 26 extends towards motor pickoff comb 20. While, in the illustrated embodiment, proof masses 12 have thirty-four electrodes 26, it is known to utilize proof masses incorporating different numbers of electrodes. In other embodiments of MEM devices (not shown), motor drive comb and motor pickoff comb may be located next to one another.

Proof masses 12, in the embodiment shown, are supported above a respective sense plate 22 by suspensions 14. While four suspensions 14 are depicted for suspending each proof mass 12, any number of suspensions 14 which properly support proof masses 12 may be utilized. Suspensions 14 are, in one embodiment, beams micro-machined from a silicon wafer. Suspensions 14 also act as springs allowing proof masses 12 to move within a drive plane (X-axis) and a sense plane (Y-axis), as shown in FIG. 1.

Motor drive combs 18 include a plurality of comb-like electrodes 28 extending towards a respective proof mass 12. While motor drive combs 18 are shown as having eighteen electrodes 28, the number of electrodes 28 on motor drive combs 18 typically is determined by the number of electrodes 26 on the respective proof mass 12. Motor drive combs are typically connected to drive electronics (not shown in FIG. 1). Electrodes 26 and electrodes 28 are interdigitated as they extend from respective proof masses 12 and motor drive combs 18 and form capacitors which are utilized to generate motion in the drive plane (X-axis).

Motor pickoff combs 20 also include a plurality of comb-like electrodes 30 extending towards a respective proof mass 12. While motor pickoff combs 20 are depicted as having eighteen electrodes 30, the number of electrodes 30 extending from motor pickoff combs 20 is typically determined by the number of electrodes 26 on a respective proof mass 12. Motor pickoff combs 20 are sometimes referred to as sense combs.

Electrodes 26 and electrodes 30 are interdigitated as they extend from respective proof masses 12 and motor pickoff combs 20 and form capacitors which are utilized to sense motion in the drive plane (X-axis).

Sense plates 22 are parallel with their respective proof mass 12 and form a capacitor. If an angular rate (i.e. an aircraft turning) is applied to MEMS device 10 operating as a gyroscope along an input vector (Z-axis) while the at least one proof mass 12 is oscillating along the drive plane (X-axis), a Coriolis acceleration is detected in the sense plane (Y-axis). The capacitance is used to sense motion in the sense plane (Y-axis). An output of MEMS device 10 typically is a signal proportional to the change in capacitance caused by the motion. Sense plates 22 are typically connected to sense electronics, not shown in FIG. 1. Sense electronics detect changes in capacitance as proof masses 12 move toward and/or away from their respective sense plates 22 and the respective motor drive combs 18 and motor pickoff combs 20.

Motor pickoff combs 20 are typically connected to a bias voltage (not shown) used in sensing motion of proof masses 12. Motor drive combs 18 are typically connected to drive electronics (not shown). The drive electronics cause the respective proof mass 12 to oscillate at substantially a tuning fork frequency along the drive plane (X-axis) by using the capacitors formed by the plurality of interdigitated comb-like electrodes 26, 28 of proof mass 12 and motor drive comb 18. MEMS device 10 has two closely spaced modes of oscillation. One of the modes, sometimes referred to as a motor mode, is driven by an electrostatic force, at a resonant frequency of device 10 to produce a relatively large amplitude of oscillation. When a rotational force is applied to device 10, a Coriolis force is produced which is proportional to the velocity of proof mass 12 in the motor mode. The Coriolis force drives proof masse 12 in a sense mode direction at a frequency of the motor mode. One or more electrodes are provided to detect oscillations in the sense mode, as described below, utilizing capacitance. A DC and/or an AC bias voltage is applied to sense electrodes, so that a motion of proof masses 12 in the sense mode produces an output current.

In certain operating environments, MEMS devices, for example, gyroscopes are subjected to extreme shock and vibration exposure, but also have to be mechanically sensitive enough to measure minute angular velocities and linear accelerations. Such forces may cause extensions 26 of proof masses 12 to forcefully come into contact with one or more of motor drive comb 18, its extensions 28, motor pickoff comb 20, and its extensions 30. In addition to a possibility that one or more of extensions 26, 28, and 30 could be broken off or otherwise damaged, electrostatic forces might cause proof mass 12 to remain in physical contact with the component of device 10 the proof mass 12 has contacted. Other forces may cause the main body of proof mass 12 to come into contact with sense plate 22. Again, the electrostatic forces may cause proof mass 12 to remain in contact with sense plate 22.

MEMS device 10 is also configured with a plurality of deceleration stops 50 which reduce or alleviate the above described operational problems caused by excessive external mechanical forces. Device 10 utilizes deceleration stops 50 to provide the external force protection. Proof masses 12 are further identified as a left proof mass 54 and a right proof mass 56. The terms "left" and "right" as used herein are for illustrative purposes with respect to the Figures only to describe operation of deceleration stops 50, and do not imply any type of structural limitations of MEMS device 10. Left proof mass 54 and right proof mass 56 are supported above the substrate, as described above, by suspensions 14. While suspensions 14 suspend proof masses 54 and 56 above a substrate (not shown) onto which a sense plate (not shown) is typically mounted, suspensions 14 also allow proof masses 54 and 56 to vibrate upon application of a bias voltage. As proof masses 54 and 56 vibrate, extensions 26 move back and forth between extensions 28 of motor drive combs 18 and extensions 30 of motor pickoff combs 20, causing capacitance changes which can be quantified.

Figure 2:
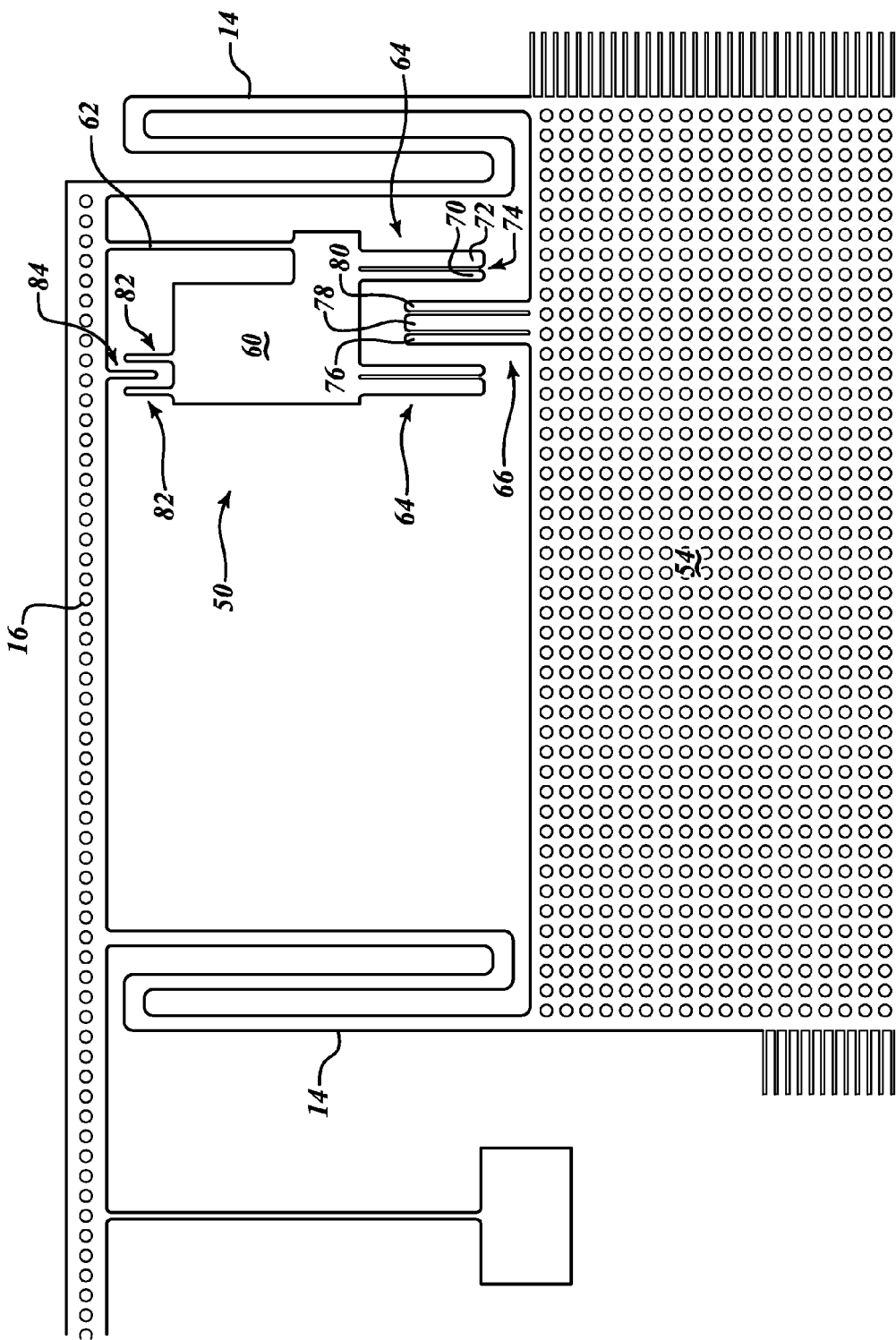
FIG. 2 is an illustration showing an enlarged view of deceleration-stopping structure that can be implemented in the device shown in FIG. 1.

FIG. 2 is an illustration that details a deceleration stop 50, which operates to prevent left proof mass 54 from contacting motor drive comb 18 and motor sense comb 20. While a single deceleration stop 50 is illustrated and described with respect to left proof mass 54, it is to be understood that the description applies to deceleration stops utilized in conjunction with any proof mass (including right proof mass 56) and that multiple deceleration stops 50 can be associated with any individual proof mass (as shown in FIG. 1).

Deceleration stop 50 includes a body 60 which, in one embodiment, is located between cross beam 16 and proof mass 54, and is attached to crossbeam 16 through an anchoring extension 62. In one embodiment, body 60 is attached to the substrate and provides an anchoring function for the MEMS device. As illustrated in FIG. 2, and in an embodiment, the suspensions 14 may have a convoluted or serpentine configuration so as to provide the suspensions a spring-like functionality.

In addition, a plurality of deceleration beams 64 extend from body 60 towards proof mass 54. As illustrated in FIG. 2, and in an embodiment, one or more of the beams 64 may include a plurality of tines 70, 72 of uniform or varying width and separated from one another by respective gaps 74.

At least one deceleration extension 66 located in between deceleration beams 64 extends from proof mass 54. As illustrated in FIG. 2, and in an embodiment, the extension 66 may include a plurality of tines 76, 78, 80 of uniform or varying width and separated from one another by respective gaps similar to gap 74.

As further illustrated in FIG. 2, and in an embodiment, an additional plurality of deceleration beams 82 extend from the body 60, and an additional deceleration extension 84 extends from the crossbeam 16. The beams 82 and extension 84 may be tined in the manner described above with reference to deceleration beams 64 and deceleration extension 66.

Deceleration beams 64, 82, deceleration extensions 66, 84, and serpentine suspensions 14 allow proof mass 54 to move freely under normal motion conditions, but serve to decelerate proof mass 54 when the motion of proof mass 54 exceeds a certain limit. In one embodiment, deceleration beams 64, 82 are positioned closer to extensions 66, 84 than proof mass 54 is to combs 28 and 30. As shown in FIGS. 1 and 2, deceleration beams 64, 82 and deceleration extensions 66, 84, in one embodiment, are elongated rectangular structures.

Specifically, when a motion of proof mass 54 causes one or more of deceleration extensions 66, 84 to engage one or more of deceleration beams 64, 82, due to an external force, one or more of deceleration beams 64, 82 and deceleration extensions 66, 84 bend, decelerating proof mass 54 such that when proof mass 54 contacts a fixed stop, an impact is significantly reduced or eliminated. The deceleration of proof mass 54 due to deceleration stops 50 prevents damage to the interdigitating members of proof mass 54, motor drive comb 18, and motor pickoff comb 20. Moreover, the tined configuration of the beams 64, 82 and/or extensions 66, 84 enable deceleration of the proof mass 54 to occur in successive stages. That is, for example, upon sudden movement of the proof mass 54 to the right in FIG. 2, tine 80 and tine 70 may engage one another and bend prior to tine 78 and tine 72 bending and, perhaps, obviate the need for tine 78 and tine 72 to bend.

While a preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A micro-electromechanical systems (MEMS) device comprising:
   a substrate comprising at least one anchor;
   a proof mass comprising first and second deceleration extensions extending from said proof mass;
   a motor drive comb;
   a motor sense comb;
   a plurality of suspensions configured to suspend said proof mass over said substrate and between said motor drive comb and said motor sense comb, said suspensions anchored to said substrate;
   a body attached to said substrate; and
   at least one first deceleration beam extending from a first side of said body, said at least one first deceleration beam configured to engage at least one of said first and second deceleration extensions and slow or stop said proof mass before said proof mass contacts said motor drive comb and said motor sense comb; and
   at least one second deceleration beam extending from a second side of said body, said at least one second deceleration beam configured to engage at least one deceleration extension extending from at least one crossbeam and slow or stop said proof mass before said proof mass contacts said motor drive comb and said motor sense comb.

2. A device according to claim 1 wherein said device further comprises said at least one crossbeam extending between said plurality of suspensions, said body connected to said at least one crossbeam and attached to said substrate.

3. A device according to claim 2 wherein said device further comprises an anchoring extension which is utilized to connect said body to said at least one crossbeam.

4. A device according to claim 1 wherein said device further comprises:
   the at least one crossbeam extending between said plurality of suspensions; and
   an anchor attached to said at least one crossbeam and said substrate, said body connected to said at least one crossbeam.

5. A device according to claim 1 wherein at least one of said first and second deceleration extensions comprises:
   a bottom surface; and
   at least one raised area on said bottom surface, said at least one raised area configured to reduce or eliminate contact between said proof mass and components of said device under said proof mass.

6. A device according to claim 1 wherein at least one of said first and second deceleration extensions comprises:
   a top surface; and
   at least one raised area on said top surface, said at least one raised area configured to reduce or eliminate contact between said proof mass and components of said device above said proof mass.

7. A device according to claim 1 wherein each of said plurality of suspensions has a serpentine configuration.

8. A device according to claim 1 wherein said at least one first deceleration beam comprises:
   at least two deceleration beams disposed on a first side of the first and second deceleration extensions and configured to slow or stop motion of said proof mass in a first direction; and
   at least two deceleration beams disposed on a second side of the first and second deceleration extensions and configured to slow or stop motion of said proof mass in a second direction.

9. A device according to claim 8, wherein said at least two deceleration beams disposed on the first side of the first and second deceleration extensions have respective first and second widths, said first width being smaller than said second width.

10. A device according to claim 9, wherein said at least two deceleration beams disposed on the second side of the first and second deceleration extensions have respective first and second widths, said first width being smaller than said second width.

11. A device according to claim 1 wherein said first and second deceleration extensions, said at least one first deceleration beam and said at least one second deceleration beam are configured to bend when engaged and provide the deceleration function for said proof mass.

12. A device according to claim 1 wherein:
   said first and second deceleration extensions have respective first and second widths; and
   said first width is smaller than said second width.

13. A device according to claim 1, wherein said proof mass further comprises a third deceleration extension extending from said proof mass.

14. A device according to claim 1 wherein said device comprises at least one of a gyroscope, an inertial measurement unit, an accelerometer, a pressure sensor and a temperature sensor.

15. A deceleration stop for a micro-electromechanical systems (MEMS) device, the MEMS device comprising a substrate and at least one proof mass, said deceleration stop comprising:
   a body;
   at least one deceleration extension extending from said at least one proof mass;
   first and second deceleration beams extending from said body toward said at least one proof mass, disposed on a first side of the deceleration extension and configured to slow or stop motion of said at least one proof mass in a first direction;
   third and fourth deceleration beams extending from said body toward said at least one proof mass, disposed on a second side of the deceleration extension and configured to slow or stop motion of said at least one proof mass in a second direction, said deceleration extension configured to engage at least one of said deceleration beams and cause said at least one proof mass to slow or stop before contacting components of the MEMS device adjacent to said at least one proof mass; and
   a fifth deceleration beam extending from said body toward a crossbeam said fifth deceleration beam configured to engage at least one deceleration extension extending from at least one crossbeam and slow or stop said proof mass before said proof mass contacts said motor drive comb and said motor sense comb.

16. A deceleration stop according to claim 15 wherein said body is anchored to the substrate.

17. A deceleration stop according to claim 16 further comprising an anchoring extension which is utilized to connect said body to the crossbeam of the MEMS device.

18. A deceleration stop according to claim 15 wherein said at least one deceleration extension extending from said at least one proof mass comprises first, second and third deceleration extensions having respective first, second and third widths, wherein said first and second widths are smaller than said third width.

19. A device according to claim 15, wherein said first and second deceleration beams extending from said body toward said at least one proof mass have respective first and second widths, said first width being smaller than said second width.

20. A gyroscope, comprising:
a substrate;
at least one crossbeam anchored to said substrate;
at least one proof mass, said at least one proof mass comprising first and second deceleration extensions;
a plurality of suspensions connected to a respective one of said at least one crossbeam and configured to suspend said at least one proof mass above said substrate;
motor drive combs adjacent said at least one proof mass;
motor sense combs adjacent said at least one proof mass;
at least one body attached to said at least one crossbeam;
first and second deceleration beams extending from said at least one body toward said at least one proof mass, the first and second deceleration beams disposed on a first side of the first and second deceleration extensions and configured to slow or stop motion of said at least one proof mass in a first direction;
third and fourth deceleration beams extending from said at least one body toward said at least one proof mass, the third and fourth deceleration beams disposed on a second side of the first and second deceleration extensions and configured to slow or stop motion of said at least one proof mass in a second direction, said first and second deceleration extensions configured to engage at least one of said first, second, third, or fourth deceleration beams and cause said at least one proof mass to slow or stop before contacting said motor drive combs and said motor sense combs; and
at least one fifth deceleration beam extending from a second side of said body toward said crossbeam, said at least one fifth deceleration beam configured to engage at least one deceleration extension extending from said at least one crossbeam and slow or stop said proof mass before said proof mass contacts said motor drive comb and said motor sense comb.

* * * * *